United States Patent
Hoshino et al.

(10) Patent No.: US 7,842,937 B2
(45) Date of Patent: Nov. 30, 2010

(54) EXTREME ULTRA VIOLET LIGHT SOURCE APPARATUS

(75) Inventors: Hideo Hoshino, Hiratsuka (JP); Tamotsu Abe, Hiratsuka (JP); Akira Endo, Tokyo (JP)

(73) Assignees: Komatsu Ltd., Tokyo (JP); Gigaphoton, Tokyo (JP)

( * ) Notice: Subject to any disclaimer, the term of this patent is extended or adjusted under 35 U.S.C. 154(b) by 277 days.

(21) Appl. No.: 12/071,352

(22) Filed: Feb. 20, 2008

(65) Prior Publication Data
US 2008/0197299 A1 Aug. 21, 2008

(30) Foreign Application Priority Data
Feb. 20, 2007 (JP) .............................. 2007-039811

(51) Int. Cl.
H01J 27/24 (2006.01)
A61N 5/06 (2006.01)
(52) U.S. Cl. .............................. 250/504 R; 250/493.1; 250/494.1; 250/423 P
(58) Field of Classification Search .............. 250/493.1, 250/494.1, 504 R
See application file for complete search history.

(56) References Cited

U.S. PATENT DOCUMENTS

| 6,987,279 | B2 * | 1/2006 | Hoshino et al. | 250/504 R |
| 7,217,940 | B2 * | 5/2007 | Partlo et al. | 250/504 R |
| 7,271,401 | B2 * | 9/2007 | Imai et al. | 250/504 R |
| 7,288,777 | B2 * | 10/2007 | Partlo et al. | 250/504 R |
| 7,288,778 | B2 * | 10/2007 | Partio et al. | 250/504 R |
| 7,297,968 | B2 * | 11/2007 | Endo et al. | 250/504 R |
| 7,317,196 | B2 * | 1/2008 | Partlo et al. | 250/504 R |
| 7,439,530 | B2 * | 10/2008 | Ershov et al. | 250/504 R |
| 7,480,030 | B2 * | 1/2009 | Cormont et al. | 355/69 |
| 7,598,509 | B2 * | 10/2009 | Ershov et al. | 250/504 R |
| 7,608,846 | B2 * | 10/2009 | Nakano | 250/504 R |
| 7,615,766 | B2 * | 11/2009 | Nakano | 250/504 R |
| 2009/0218522 | A1 * | 9/2009 | Nakano et al. | 250/504 R |

FOREIGN PATENT DOCUMENTS

JP  9-288251  11/1997

OTHER PUBLICATIONS

Murakami et al., "Conversion Efficiency of Extreme Ultraviolet Radiation in Laser-Produced Plasmas", American Institute of Physics, Physics of Plasmas 13, 033107 (2006), pp. 1-8.

* cited by examiner

Primary Examiner—David A Vanore
(74) Attorney, Agent, or Firm—Wenderoth, Lind & Ponack, L.L.P.

(57) ABSTRACT

An extreme ultra violet light source apparatus by which EUV light can be efficiently obtained uses a driver laser which can realize a desired pulse width with substantially homogeneous intensity. The apparatus generates extreme ultra violet light by applying a laser beam to a target, and includes a chamber in which extreme ultra violet light is generated; a target supply unit which supplies a liquid or solid metal target to a predetermined position within the chamber; a laser beam generating unit which synthesizes pulse laser beams having delays different from one another to generate a single pulse laser beam or a pulse train laser beam having substantially homogeneous intensity, and applies the laser beam to the target supplied by the target supply unit to generate plasma; and a collector mirror which collects the extreme ultra violet light radiated from the plasma and outputs it.

12 Claims, 9 Drawing Sheets

EXTREME ULTRA VIOLET LIGHT SOURCE APPARATUS

BACKGROUND OF THE INVENTION

1. Field of the Invention

The present invention relates to an extreme ultra violet (EUV) light source apparatus to be used as a light source of exposure equipment.

2. Description of a Related Art

In recent years, as semiconductor processes become finer, photolithography has been making rapid progress to finer fabrication. In the next generation, microfabrication of 100 nm to 70 nm, and even microfabrication of 50 nm or less, will be required. Accordingly, in order to fulfill the requirement for microfabrication of 50 nm or less, for example, exposure equipment is expected to be developed by combining an EUV light source generating EUV light with a wavelength of about 13 nm and reduced projection reflective optics.

As the EUV light source, there are three kinds of light sources: an LPP (laser produced plasma) light source using plasma generated by applying a laser beam to a target (hereinafter, also referred to as "LPP type EUV light source apparatus"), a DPP (discharge produced plasma) light source using plasma generated by discharge, and an SR (synchrotron radiation) light source using orbital radiation. Among them, the LPP light source has the advantages that extremely high intensity close to black body radiation can be obtained because plasma density can be considerably made larger, that light emission of only the necessary waveband can be performed by selecting the target material, and that an extremely large collection solid angle of $2\pi$ steradian can be ensured because it is a point light source having substantially isotropic angle distribution and there is no structure surrounding the light source such as electrodes. Therefore, the LPP light source is thought to be predominant as a light source for EUV lithography requiring power of several tens of watts.

Here, a principle of generating EUV light in the LPP type EUV light source apparatus will be explained. By applying a laser beam to a target material supplied into a vacuum chamber, the target material is excited and turned into plasma state. Various wavelength components including EUV light are radiated from the plasma. Then, the EUV light is reflected and collected by using an EUV collector mirror that selectively reflects a desired wavelength component (e.g., a component having a wavelength of 13.5 nm), and outputted to an exposure unit. A multilayer film, in which thin films of molybdenum (Mo) and thin films of silicon (Si) are alternately stacked (Mo/Si multilayer film), for example, is formed on the reflecting surface of the EUV collector mirror.

In the LPP type EUV light source apparatus, the influence by neutral particles and ions emitted from the plasma is problematic especially when a solid target is used. Since the EUV collector mirror is located near the plasma, the neutral particles emitted from the plasma are deposited on the reflecting surface of the EUV collector mirror and reduce the reflectance of the mirror. On the other hand, the ions emitted from the plasma cut the multilayer film formed on the reflecting surface of the EUV collector mirror. The scattered materials from the plasma, including neutral particles and ions and the remains of the target materials, are called debris.

Recently, it has been confirmed that, with the combination of $CO_2$ laser and solid tin target, the amount of debris generated from tin due to application of laser beam is significantly reduced. Further, as described in Murakami et al., "Conversion efficiency of extreme ultraviolet radiation in laser-produced plasmas" (American Institute of Physics, PHYSICS OF PLASMAS 13, 033107 (2006), pp. 7), regarding EUV light obtained by application of a laser beam generated by a $CO_2$ laser to a metal target, it is becoming clear that high laser light/EUV light conversion efficiency (CE) can be obtained under the condition that the pulse width of the laser beam (FWHM: full width at half maximum) is on the order of 100 ns.

However, in a $CO_2$ laser under study or a $CO_2$ laser that has been commercially available, the pulse width of laser beam is about 1 ns to 50 ns. On the other hand, in a $CO_2$ laser that performs pulse oscillation with RF modulation, the pulse width of laser beam is about several microseconds. A laser system that can realize the pulse width of about 100 ns with substantially homogeneous intensity has not been proposed yet.

As a related technology, Japanese Patent Application Publication JP-A-9-288251 discloses a pulse width elongation optics that reduces average energy within emission time by pseudo prolongation of emission time of pulse light. The pulse width elongation optics includes light dividing means for dividing pulse light along plural optical paths, and light synthesizing means for synthesizing the divided pulse light along the plural optical paths into pulse light along the same optical path, and the plural optical paths have predetermined differences in optical path from one another so that the intensity of the pulse light synthesized along the same optical path is substantially smaller than the intensity of the original pulse light before division along the plural optical paths. However, since the intensity gradually reduces as the pulse light is divided, it is difficult to generate pulse light with homogeneous intensity.

SUMMARY OF THE INVENTION

In view of the above-mentioned points, a purpose of the present invention is to provide an extreme ultra violet light source apparatus by which EUV light can be efficiently obtained by using a driver laser which can realize a desired pulse width with substantially homogeneous intensity.

In order to accomplish the above purpose, an extreme ultra violet light source apparatus according to one aspect of the present invention is a laser produced plasma type extreme ultra violet light source apparatus for generating extreme ultra violet light by applying a laser beam to a target, and includes: a chamber in which extreme ultra violet light is generated; a target supply unit which supplies a liquid or solid metal target to a predetermined position within the chamber; a laser beam generating unit which synthesizes pulse laser beams having delays different from one another to generate a single pulse laser beam or a pulse train laser beam having substantially homogeneous intensity, and applies the laser beam to the target supplied by the target supply unit to generate plasma; and a collector mirror which collects the extreme ultra violet light radiated from the plasma and outputs the extreme ultra violet light.

According to the present invention, the pulse laser beams having delays different from one another are synthesized to generate a single pulse laser beam or a pulse train laser beam having substantially homogeneous intensity, and therefore, EUV light can be efficiently obtained.

DETAILED DESCRIPTION OF THE INVENTION

Hereinafter, preferred embodiments of the present invention will be explained in detail by referring to the drawings. The same reference numerals are assigned to the same component elements and duplicative description thereof will be omitted.

Figure 1:
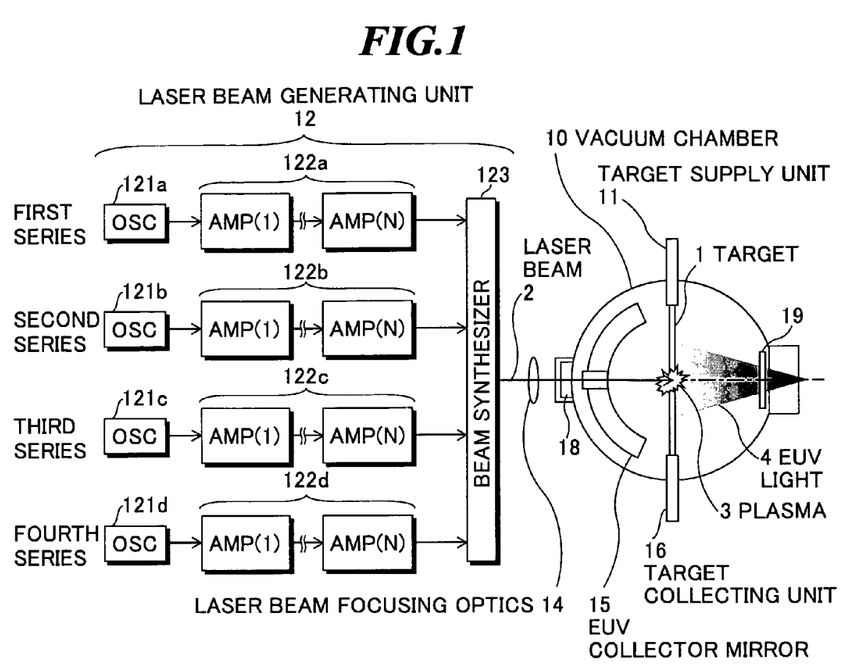
FIG. 1 is a schematic view showing a configuration of an EUV light source apparatus according to the first embodiment of the present invention.

FIG. 1 is a schematic view showing a configuration of an EUV light source apparatus according to the first embodiment of the present invention. The EUV light source apparatus according to the embodiment adopts a laser produced plasma (LPP) type of generating EUV light by applying a laser beam to a target material for excitation.

As shown in FIG. 1, the EUV light source apparatus includes a vacuum chamber 10 in which EUV light is generated, a target supply unit 11 that supplies a target 1, a laser beam generating unit (driver laser) 12 that generates an excitation laser beam 2 to be applied to the target 1, a laser beam focusing optics 14 that collects the excitation laser beam 2 generated by the laser beam generating unit 12, an EUV collector mirror 15 that collects and outputs EUV light 4 emitted from plasma 3 generated when the excitation laser beam 2 is applied to the target 1, and a target collecting unit 16 that collects the target 1.

The vacuum chamber 10 is provided with a lead-in window 18 that leads in the excitation laser beam 2, and an SPF (spectral purity filter) 19 that removes unwanted lights (electromagnetic waves having shorter wavelengths than the EUV light, ultraviolet light having longer wavelengths than the EUV light, and so on) from among EUV lights radiated from plasma and allows a predetermined wavelength component (e.g., a component having a wavelength of 13.5 nm) to pass and leads it out to an exposure unit. The interior of the exposure unit is also held in vacuum or under reduced pressure like the interior of the vacuum chamber 10.

The laser beam generating unit 12 includes plural series of oscillation and amplification laser arrangements, and a beam synthesizer 123 that synthesizes pulse laser beams respectively outputted from those oscillation and amplification laser arrangements. FIG. 1 shows the first to fourth series of oscillation and amplification laser arrangements having oscillation laser devices (OSCs) 121a-121d and amplification devices 122a-122d. For example, the first series of oscillation amplification laser arrangement includes the oscillation laser device 121a, and the amplification device 122a including N amplifiers AMP(1) to AMP(N) that amplify the pulse laser beam outputted from the oscillation laser device 121a. Here, "N" is a natural number, and each series of oscillation and amplification laser arrangement includes at least one amplifier.

In the embodiment, as the oscillation laser devices 121a-121d, $CO_2$ lasers capable of pulse oscillation at a high repetition frequency (e.g., the pulse width is about several nanoseconds to several tens of nanoseconds, and the repetition frequency is about 1 kHz to 100 kHz) are used. Further, as the beam synthesizer 123, a prism, a polarizer, a mirror having a three-dimensional shape, or the like can be used.

In the respective laser series, the laser light generated by oscillation in the oscillation laser devices 121a-121d is sequentially amplified by the amplification devices 122a-122d including N amplifiers, and thereby, desired laser energy is achieved. In the embodiment, the energy obtained in each laser series is about 20 mJ, and the energies are integrated and synthesized to provide laser energy of about 80 mJ. The pulse laser beams respectively outputted from the first to fourth series of oscillation and amplification laser arrangements are synthesized by the beam synthesizer 123, and supplied to the laser beam focusing optics 14.

Figure 2:
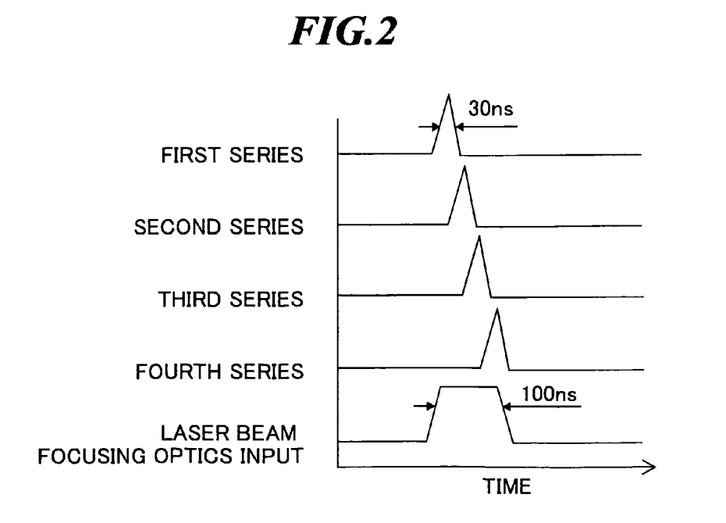
FIG. 2 shows timing and waveforms of plural pulses in the first embodiment.

As shown in FIG. 2, the first to fourth series of oscillation and amplification laser arrangements are driven with timing that is sequentially delayed. The pulse width of the laser beam outputted from each series of oscillation and amplification laser arrangement is about 30 ns. A laser device that achieves such a pulse width is easily available in the market. For example, as the oscillation laser device, a TEA laser or a slab laser may be used. Alternatively, the above-mentioned pulse width may be obtained by cavity dump or the like using an axial flow continuous-wave laser. Since those lasers typically can output energy of several microjoules, the amplification devices shown in FIG. 1 are necessary to obtain energy of several tens of microjoules for EUV light generation.

In this manner, by driving the plural series of oscillation and amplification laser arrangements with time differences and synthesizing the pulse laser beams after amplification outputted from the oscillation and amplification laser arrangements, a single pulse laser beam having a pulse width on the order of 100 ns and energy of 80 mJ can be obtained at the input of the laser beam focusing optics 14.

The laser beam focusing optics 14 includes at least one lens and/or at least one mirror. The laser beam obtained by the laser beam generating unit 12 is collected by the laser beam focusing optics 14, and applied to the target 1 at a predetermined position within the vacuum chamber 10. In this regard, the collection diameter is about 100 μm and the power density is about $10^{10}$ W/cm². Thereby, part of the target 1 is excited and turned into a plasma state, and various wavelength components are radiated from a light emission point. Here, the light emission point refers to a position where the plasma 3 is generated.

The EUV collector mirror 15 is a collection optics that selectively reflects and collects a predetermined wavelength component (e.g., EUV light near 13.5 nm) from among the various wavelength components radiated from the plasma 3. The EUV collector mirror 15 has a concave reflecting surface, and a multilayered film of molybdenum (Mo) and silicon (Si)

for selectively reflecting the EUV light having a wavelength of near 13.5 nm, for example, is formed on the reflecting surface.

The EUV light is collected by the EUV collector mirror 15, the wavelength purity thereof is improved by the SPF 19, and then, the EUV light is outputted to the exposure unit. The collector optics for EUV light is not limited to the EUV collector mirror 15 shown in FIG. 1, but the collector optics may be constructed by using plural optical components. The collector optics must be reflection optics in order to suppress absorption of EUV light.

Conventionally, in plasma generation of the EUV light source apparatus, it has been assumed that the optimal energy absorption density can be maintained only in the period of about 10 ns-30 ns from the laser beam application to the target. In that case, the EUV conversion efficiency (CE) is 2% to 4% when using a tin target. Accordingly, the pulse width of laser beam has been determined depending on CE. However, as described above, it is becoming clear that the period, in which the optimal energy absorption density is maintained, lasts for on the order of 100 ns. In this case, more laser energy can be used for EUV light generation, and CE is improved by several percents. In view of this point, in the embodiment, it is made possible to generate the laser beam having a pulse width on the order of 100 ns while keeping substantially homogeneous intensity.

In the embodiment, a tin (Sn) thin wire is used as the target 1. However, the present invention is not limited to that; for example, indium or lithium may be used as the target material other than tin, and as a form of the target, in addition to jet or droplet of a melted metal, a bulk target of solid plate or solid sphere may be used.

In the LPP type EUV light source apparatus, the cost ratio of the driver laser among components is very high, and in some cases, exceeds 80% of the price of the entire apparatus. Therefore, the price reduction of the driver laser means significant reduction in the price of the entire apparatus. According to the embodiment, EUV can be generated with high efficiency by using small-sized and relatively inexpensive $CO_2$ lasers. Depending on the application condition of laser beam, for example, CE is improved by about 2% and CE of 5% to 6% can be obtained, and thus, the energy of the laser beam required for generation of EUV light having the equal energy to that in the conventional case becomes ½ to ⅔ of the conventional case. This leads to dramatic cost reduction in a production model EUV light source apparatus that is expected to cost several hundreds of million yen. Further, since there is little optical energy other than EUV light and little wasteful heat generation, the effect in reduction of running cost because of improvement in the lives of the collector mirror and the SPF can be expected.

Next, the second embodiment of the present invention will be explained. The second embodiment is different from the first embodiment in configuration of the laser beam generating unit, but the rest is the same as that of the first embodiment.

Figure 3:
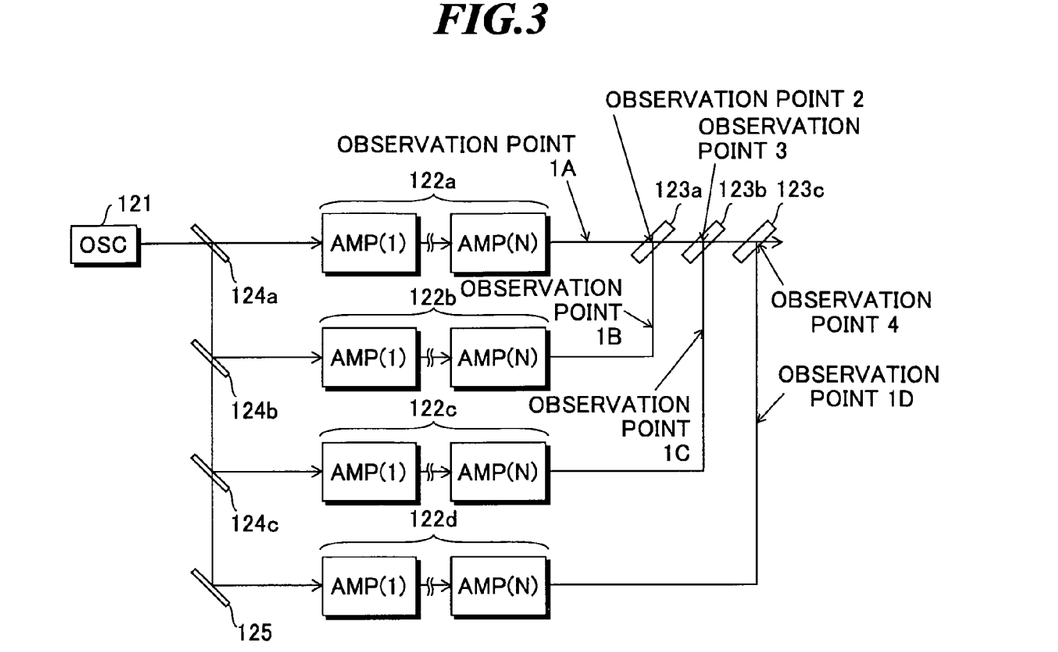
FIG. 3 shows a configuration of a laser beam generating unit in an EUV light source apparatus according to the second embodiment of the present invention.

FIG. 3 shows a configuration of a laser beam generating unit in an EUV light source apparatus according to the second embodiment of the present invention. The laser beam generating unit 12 includes an oscillation laser device 121 that outputs a pulse laser beam, beam splitters 124a-124c and a mirror 125 as beam dividing means for dividing the pulse laser beam outputted from the oscillation laser device 121 into plural optical paths, plural amplification devices 122a-122d that amplify the divided pulse laser beams respectively, and beam synthesizers 123a-123c that synthesize the pulse laser beams respectively outputted from those amplification devices 122a-122d. As the beam synthesizers 123a-123c, prisms, polarizers, or the like can be used.

Figure 4A:
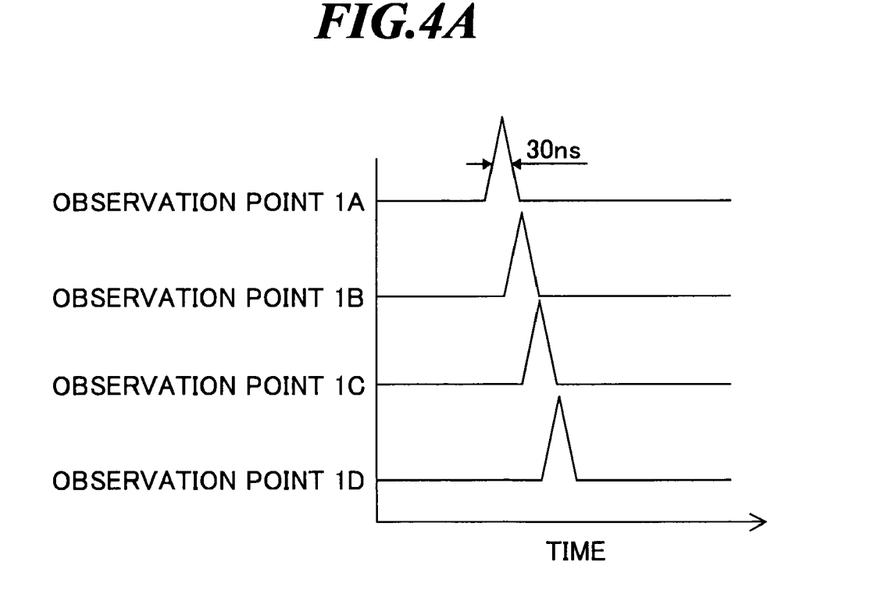
FIGS. 4A and 4B show timing and waveforms of plural pulses in the second embodiment.

As shown in FIG. 4A, the pulse width of the laser beam outputted from the oscillation laser device 121 is about 30 ns, the divided pulse laser beams are amplified by the plural amplification devices 122a-122d, and the pulses are observed with sequentially delayed timing at observation points 1A-1D.

Figure 4B:
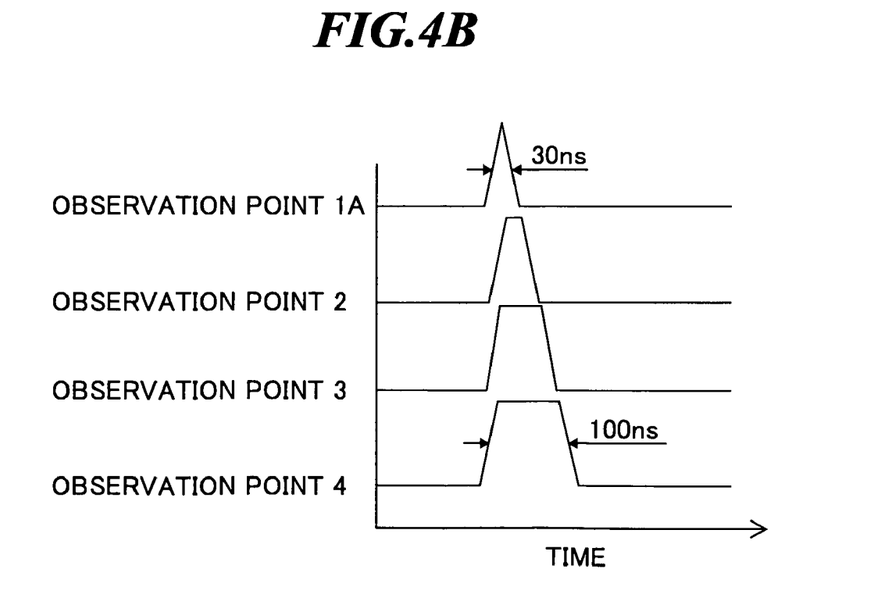

The pulse laser beams respectively outputted from the plural amplification devices 122a-122d are sequentially synthesized by the beam synthesizers 123a-123c, and thereby, as shown in FIG. 4B, the pulse widths sequentially increase at observation points 2-4 and a single pulse laser beam having a pulse width on the order of 100 ns with substantially homogeneous intensity can be obtained at the observation point 4. In the embodiment, the timing control of the oscillation laser device is unnecessary. Therefore, the control load of the entire EUV light source apparatus can be reduced, and a reliable control system can be realized.

Figure 5:
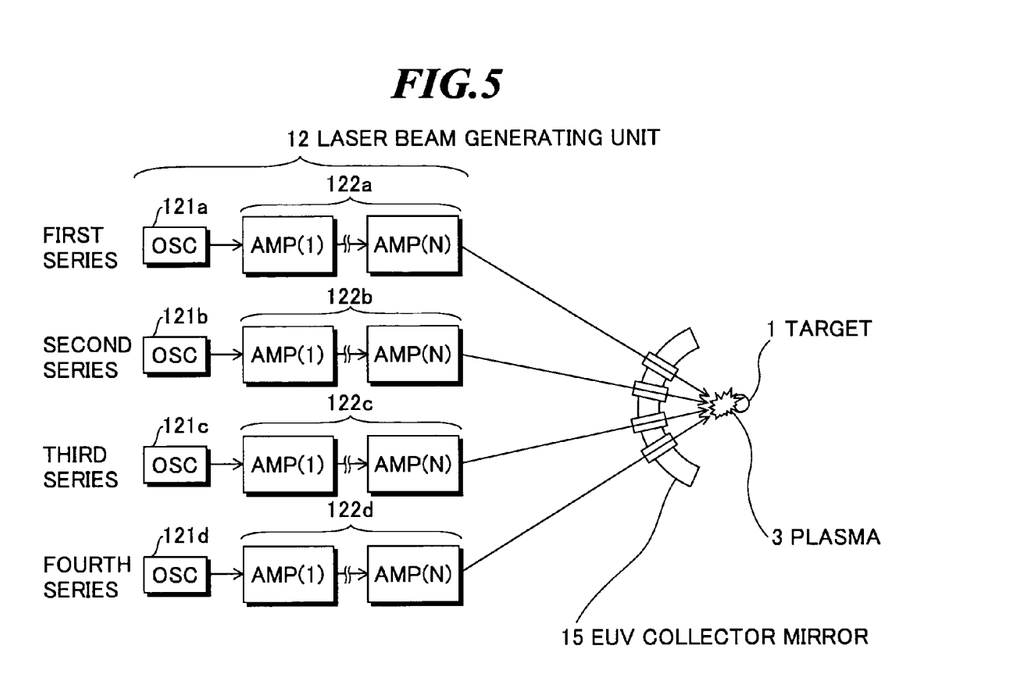
FIG. 5 shows a modified example of the first embodiment of the present invention.

Next, modified examples of the first and second embodiments will be explained. In the first embodiment shown in FIG. 1, the beam synthesizer 123 is used for synthesizing plural laser beams. However, as shown in FIG. 5, plural openings for respectively passing plural laser beams may be formed in the EUV collector mirror 15, so that the plural laser beams respectively outputted from the plural amplification devices 122a-122d may be synthesized in a position where the plasma 3 is generated (a laser beam application point in the target 1).

Figure 6:
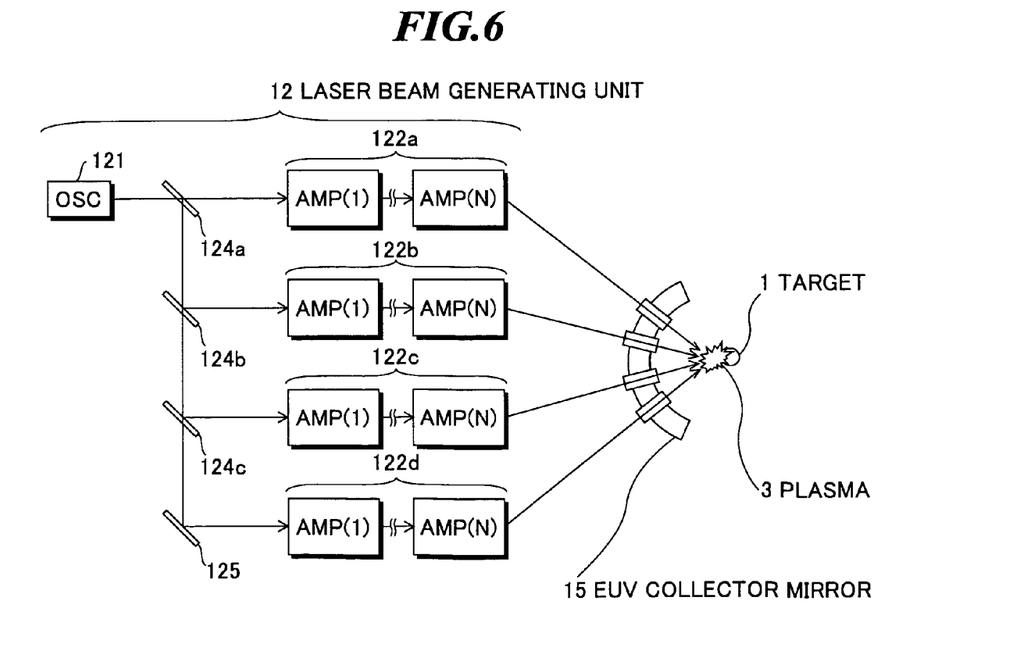
FIG. 6 shows a modified example of the second embodiment of the present invention.

Further, in the second embodiment shown in FIG. 3, the beam synthesizers 123a-123c are used for synthesizing plural laser beams. However, as shown in FIG. 6, plural openings for respectively passing plural laser beams may be formed in the EUV collector mirror 15, so that the plural laser beams respectively outputted from the plural amplification devices 122a-122d may be synthesized in a position where the plasma 3 is generated (a laser beam application point in the target 1).

In the first and second embodiments, the plural pulses respectively outputted from the plural series of oscillation and amplification laser arrangements are synthesized and then guided to the application point. On the other hand, in the case where the plural pulses are synthesized at the laser beam application point, the energy of each pulse until reaching the laser beam application point may be reduced, and thus, the damage on the optical elements in the passage route of the laser pulses can be reduced.

Next, the third embodiment of the present invention will be explained. The third embodiment is different from the first embodiment in configuration of the laser beam generating unit, but the rest is the same as that of the first embodiment.

Figure 7:
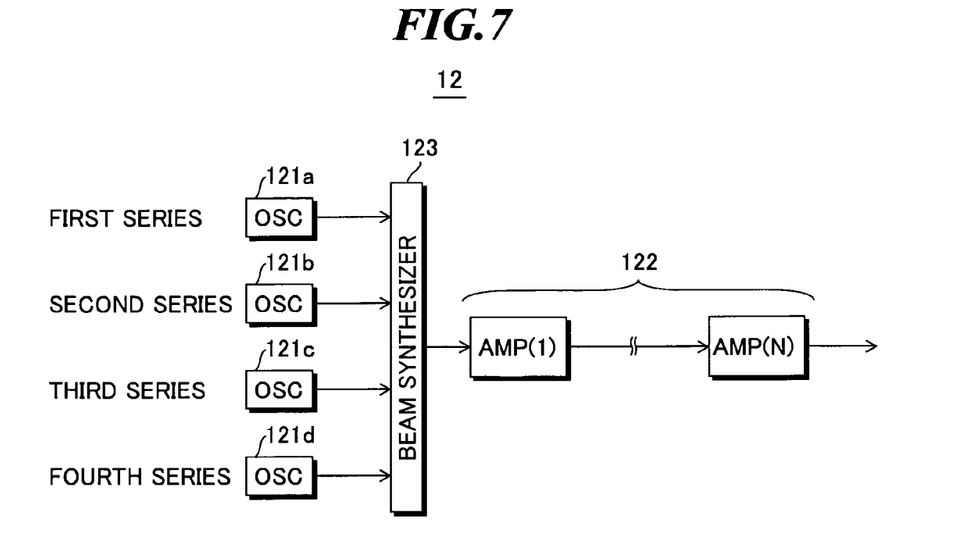
FIG. 7 shows a configuration of a laser beam generating unit in an EUV light source apparatus according to the third embodiment of the present invention.

FIG. 7 shows a configuration of a laser beam generating unit in an EUV light source apparatus according to the third embodiment of the present invention. In the laser beam generating unit in the first embodiment shown in FIG. 1, four series of oscillation and amplification laser arrangements are used, in which the plural oscillation laser devices and the plural amplification devices are arranged in series, respectively. On the other hand, in the third embodiment shown in FIG. 7, plural oscillation laser devices are prepared, while an amplification device is used in common.

The laser beam generating unit 12 includes plural oscillation laser devices (OSCs) 121a-121d that respectively output pulse laser beams, a beam synthesizer 123 that synthesizes the pulse laser beams respectively outputted from the oscillation laser devices 121a-121d, and an amplification device 122 including N amplifiers AMP(1) to AMP(N) that amplify a single pulse laser beam outputted from the beam synthesizer 123. Here, "N" is a natural number.

Figure 8:
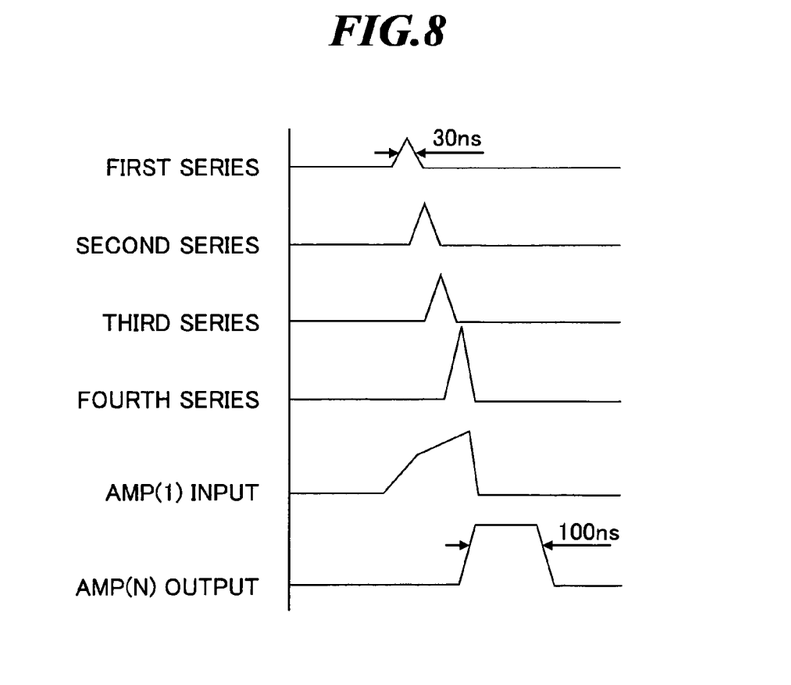
FIG. 8 shows timing and waveforms of plural pulses in the third embodiment.

As shown in FIG. 8, the first to fourth series of oscillation laser devices 121a-121d are driven with timing that is sequentially delayed. The pulse width of the laser beam outputted from each oscillation laser device is about 30 ns. Further, the plural pulses respectively outputted from the oscillation laser devices 121a-121d are set to have the lower energy at the earlier timing and have the higher energy with the longer delay time. Such plural pulses are synthesized by the beam synthesizer 123, and thus, a pulse waveform having intensity increasing with time is obtained in the input of the first amplifier AMP(1).

The reason why the pulse waveform is made is as follows. When amplification operation is performed by using the amplifiers AMP(1) to AMP(N), the amplification factor of the amplifier is higher in the earlier part in the pulse waveform. When the pulse waveform as described above is sequentially amplified by the amplifiers AMP(1) to AMP(N), a rectangular pulse having a pulse width on the order of 100 ns with substantially constant intensity can be obtained at the output of the last amplifier AMP(N). In the embodiment, although it is necessary to increase the capacity per one amplifier (excitation energy), the number of amplifiers can be reduced, and consequently, the cost may be lower.

Next, the fourth embodiment of the present invention will be explained. The fourth embodiment is different from the first embodiment in configuration of the laser beam generating unit, but the rest is the same as that of the first embodiment.

Figure 9:
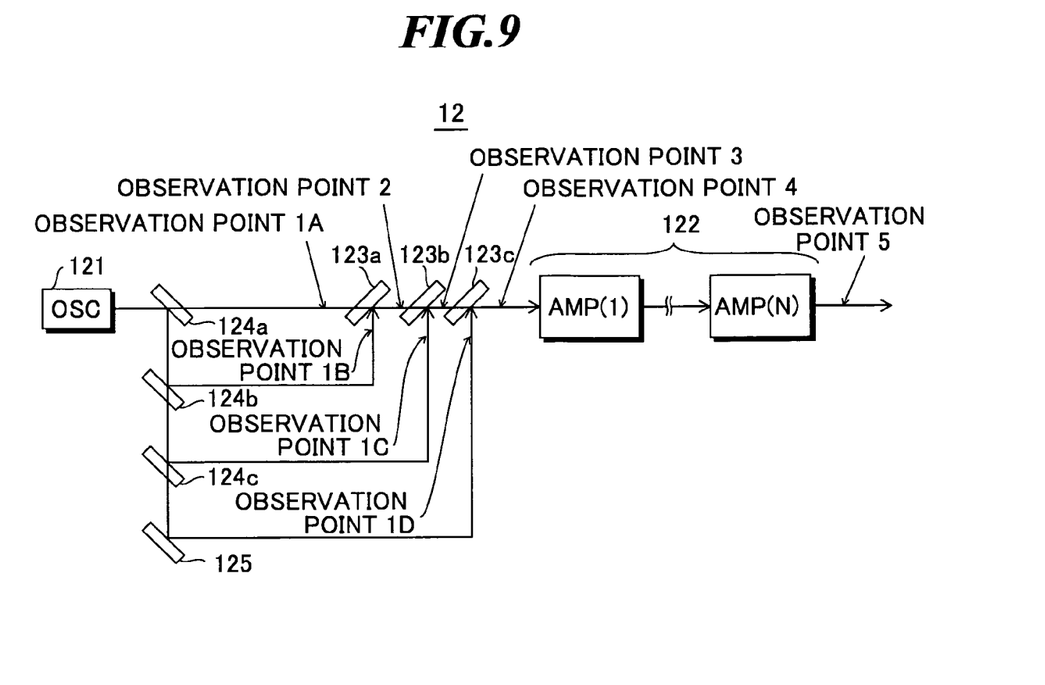
FIG. 9 shows a configuration of a laser beam generating unit in an EUV light source apparatus according to the fourth embodiment of the present invention.

FIG. 9 shows a configuration of a laser beam generating unit in an EUV light source apparatus according to the fourth embodiment of the present invention. In the laser beam generating unit in the third embodiment shown in FIG. 7, plural oscillation laser devices are used. On the other hand, in the fourth embodiment shown in FIG. 9, a laser beam outputted from one oscillation laser device is divided into plural optical paths, and thereby, plural laser beams having delays different from one another due to optical path differences are synthesized.

The laser beam generating unit 12 includes an oscillation laser device (OSC) 121 that outputs a pulse laser beam, beam splitters 124a-124c and a mirror 125 as beam dividing means for dividing the pulse laser beam outputted from the oscillation laser device 121 into plural optical paths, beam synthesizers 123a-123c that synthesize the pulse laser beams having delays different from one another depending on the optical paths, and an amplification device 122 including N amplifiers AMP(1) to AMP(N) that amplify a single pulse laser beam outputted from the beam synthesizer 123c. Here, "N" is a natural number.

Figure 10A:
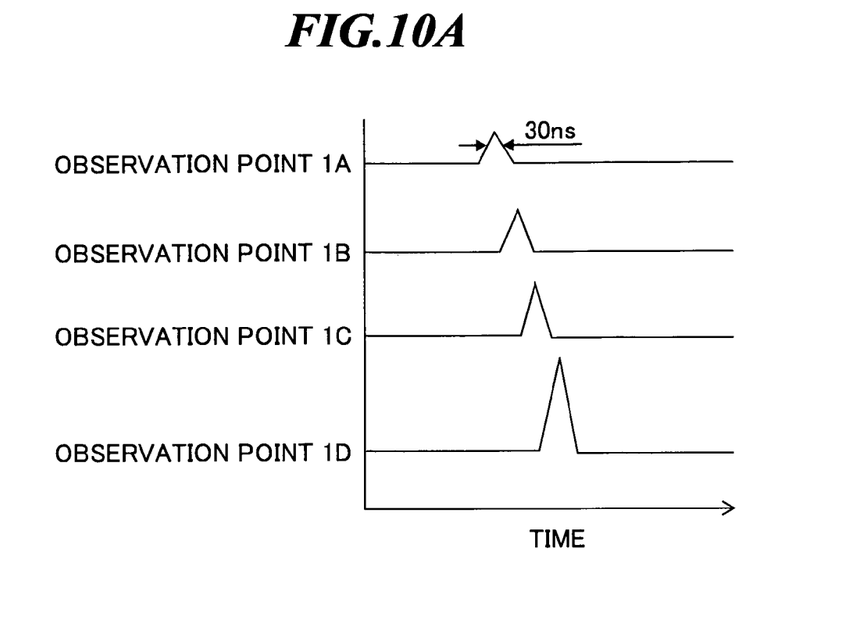
FIGS. 10A and 10B show timing and waveforms of plural pulses in the fourth embodiment.
Figure 10B:
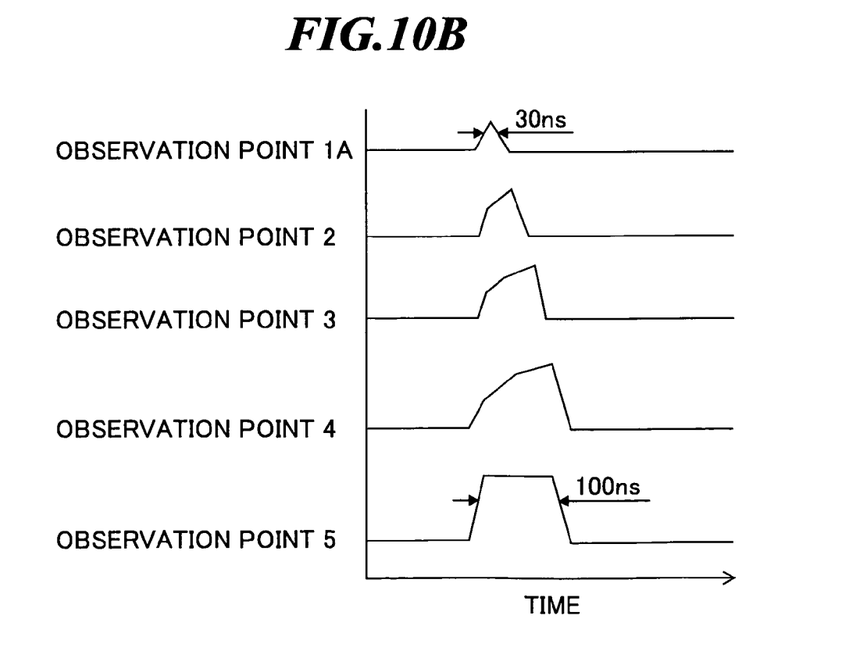

As shown in FIG. 10A, the pulse width of the laser beam outputted from the oscillation laser device 121 is about 30 ns, and the pulses are observed with sequentially delayed timing at observation points 1A-1D. The pulse laser beams respectively outputted from the beam splitters 124a-124c and mirror 125 are sequentially synthesized by the beam synthesizers 123a-123c, and thereby, as shown in FIG. 10B, the pulses as observed at observation points 2-4 are obtained. Further, by amplifying the single pulse laser beam outputted from the beam synthesizer 123c, a rectangular pulse having a pulse width on the order of 100 ns with substantially constant intensity can be obtained at the observation point 5.

Also in the embodiment, in view of the amplification characteristics of the amplifiers AMP(1) to AMP(N), it is desirable that the pulse waveform as at the observation point 4 shown in FIG. 10B is formed in the input of the amplifier AMP(1). This can be realized by providing the intensity differences as shown in FIG. 10A to the pulse intensity at the observation points 1A-1D as in the case of the third embodiment. In order to set such intensity differences, the reflectances of the beam splitters 124a-124c may be set to be gradually lower.

For example, assuming that the reflectance of the beam splitter 124a is 95%, the reflectance of the beam splitter 124b is 85%, and the reflectance of the beam splitter 124c is 55%, the energy at the observation point 1A is 5% of the energy outputted from the oscillation laser device 121, the energy at the observation point 1B is 10% of the energy outputted from the oscillation laser device 121, the energy at the observation point 1C is 30% of the energy outputted from the oscillation laser device 121, and the energy at the observation point 1D is 55% of the energy outputted from the oscillation laser device 121, and thus, the intensity ratio as shown in FIG. 10A can be nearly achieved.

According to the embodiment, only one oscillation laser device is required and the cost becomes lower. Although it is necessary to further increase the capacity of the amplifiers (excitation energy) in order to obtain desired energy by amplifying pulses with the smaller energy compared to that in the third embodiment, the configuration becomes very simple and the control load can be reduced.

Next, the fifth embodiment of the present invention will be explained. The fifth embodiment is different from the first embodiment in configuration of the laser beam generating unit, but the rest is the same as that of the first embodiment.

Figure 11:
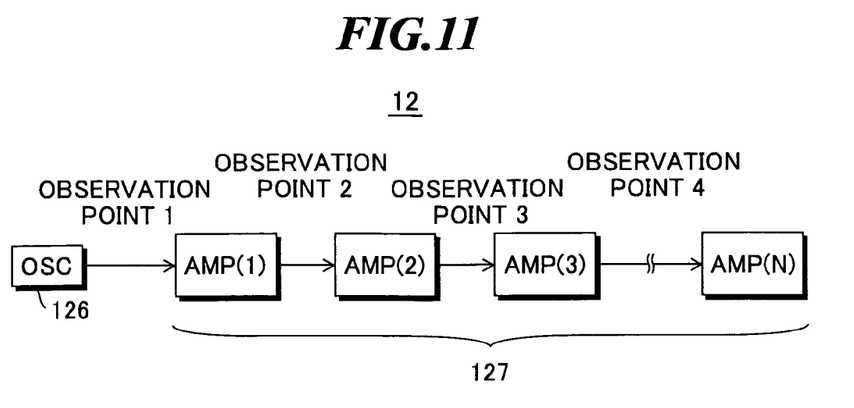
FIG. 11 shows a configuration of a laser beam generating unit in an EUV light source apparatus according to the fifth embodiment of the present invention.

FIG. 11 shows a configuration of a laser beam generating unit in an EUV light source apparatus according to the fifth embodiment of the present invention. In the laser beam generating unit in the embodiment, pulses having substantially constant intensity are generated by utilizing saturation phenomenon in laser amplification. That is, when light having intensity of a predetermined value or more is inputted to the amplification device, a phenomenon that the amplification factor asymptotically approaches to a constant value occurs, and this is used for pulse shaping.

The laser beam generating unit 12 includes an oscillation laser device (OSC) 126 that outputs a pulse laser beam having intensity increasing with time, and an amplification device including N amplifiers AMP(1) to AMP(N) that amplify the pulse laser beam outputted from the oscillation laser device 126 with an amplification factor decreasing with time. Here, "N" is a natural number.

Figure 12:
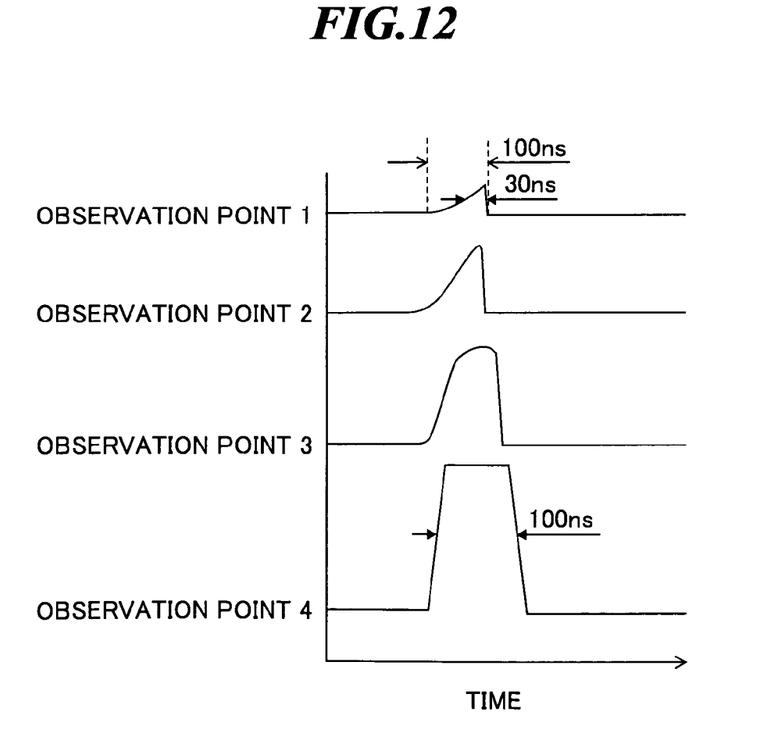
FIG. 12 shows waveforms of plural pulses in the fifth embodiment.

For example, the oscillation laser device 126 oscillates pulses having a pulse width (FWHM) of about 30 ns and a foot of about 100 ns and intensity increasing with time such as a waveform at the observation point 1 shown in FIG. 12. This is not easy for a TEA laser, but relatively easy for a laser that cuts out pulses by an optical switch such as a cavity dump. For example, by adjusting the voltage waveform to be applied to a crystal of Cd/Te or the like, such a pulse waveform can be easily formed.

When a pulse having such a waveform is allowed to pass through an amplifier with adjusted capacity (excitation energy), the former part of the pulse is amplified with a high amplification factor because it has low energy and the latter part of the pulse is amplified with a low amplification factor because the amplifier is saturated. By utilizing this phenomenon, the foot part of the pulse can be selectively amplified. When the operation is repeated in the amplifiers AMP(1) to AMP(N), the pulse width sequentially increases as at the observation points 2-4, and finally, pulses having a pulse width on the order of 100 ns with substantially constant intensity can be obtained. According to the embodiment, the capacity of the amplifier can be made smaller, and a laser system at the lower cost can be realized with the small number of control elements and relatively simple configuration.

Next, a modified example of the first to fifth embodiments will be explained. In the first to fifth embodiments, a single pulse having a pulse width on the order of 100 ns is formed as a laser beam to be applied to the target by synthesizing plural pulses. However, in place of the single pulse, a pulse train with high repetition frequency may be formed. In this case, nearly equal effects can be obtained.

Figure 13:
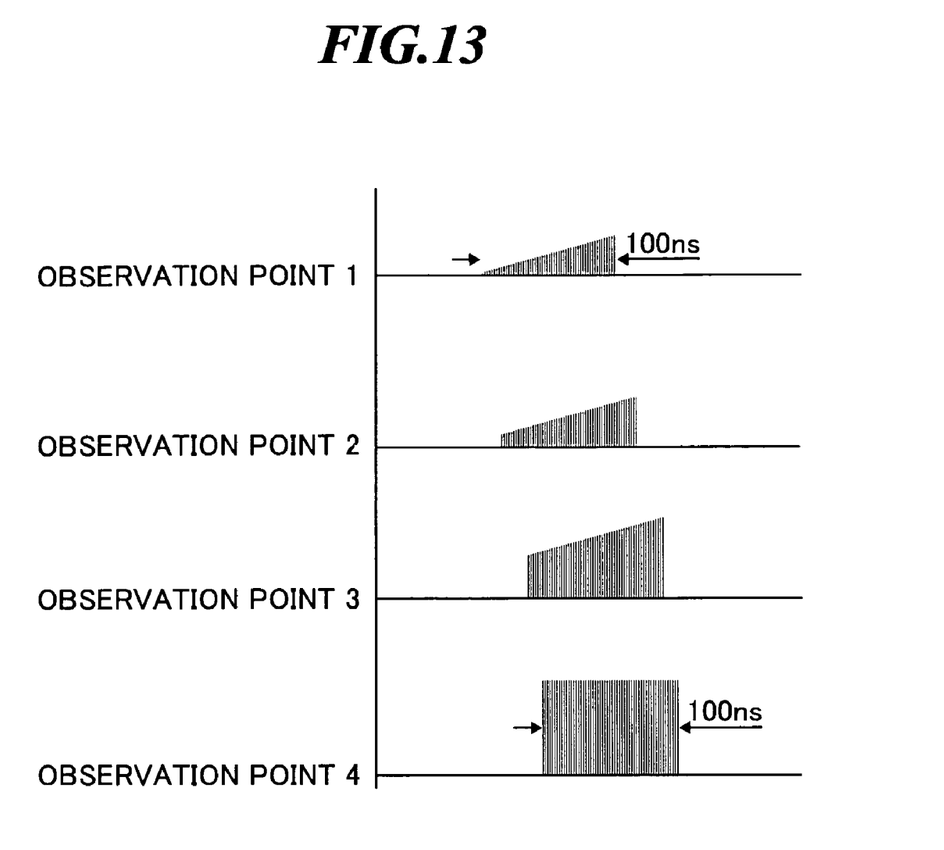
FIG. 13 shows a pulse train in a modified example of the first to fifth embodiments of the present invention.

For example, the oscillation laser device may oscillate with high repetition frequency in the same apparatus configuration as in the fifth embodiment, or the plural pulses respectively outputted from the plural oscillation laser devices may be synthesized in the same apparatus configuration as in the third embodiment. Note that, also in this case, in view of the characteristics of laser amplification, the devices are set to provide the lower energy pulses at the earlier timing in the pulse train and provide the gradually higher energy pulses with time as shown in FIG. 13.

In the modified embodiment, the independent pulses included in the pulse train become shorter pulses, compared to those in the first to fifth embodiments, having a pulse width of several nanoseconds, for example, and this can be easily realized by an EO cavity dump or the like. According to the modified embodiment, there is no need to shape the pulse waveform of the oscillation laser device into a special shape as in the fifth embodiment, and a commercially available $CO_2$ laser can be used to burst oscillate while adjusting the output of the $CO_2$ laser, and thus, the configuration is simple.

Furthermore, by the combination of two or more of the above-mentioned embodiments and modified examples, a single pulse or pulse train having substantially constant intensity may be realized.

The invention claimed is:

1. A laser produced plasma type extreme ultra violet light source apparatus for generating extreme ultra violet light by applying a laser beam to a target, said apparatus comprising:
a chamber in which extreme ultra violet light is generated;
a target supply unit which supplies a liquid or solid metal target to a predetermined position within said chamber;
a laser beam generating unit which synthesizes pulse laser beams having delays different from one another to generate one of a single pulse laser beam and a pulse train laser beam having substantially homogeneous intensity, and applies the laser beam to the target supplied by said target supply unit to generate plasma; and
a collector mirror which collects the extreme ultra violet light radiated from said plasma and outputs the extreme ultra violet light,
wherein said laser beam generating unit includes a plurality of oscillation and amplification laser arrangements which respectively generate pulse laser beams having delays different from one another, and each of said oscillation and amplification laser arrangements has an oscillation laser device which outputs a pulse laser beam and an amplification device including at least one amplifier which amplifies the pulse laser beam outputted from said oscillation laser device.

2. The extreme ultra violet light source apparatus according to claim 1, wherein said laser beam generating unit further includes beam synthesizing means for synthesizing the pulse laser beams respectively outputted from said oscillation and amplification laser arrangements.

3. The extreme ultra violet light source apparatus according to claim 1, wherein the pulse laser beams respectively outputted from said oscillation and amplification laser arrangements are synthesized in a plasma generation position.

4. The extreme ultra violet light source apparatus according to claim 1, wherein said laser beam generating unit further includes a beam synthesizer which synthesizes the pulse laser beams respectively outputted from said oscillation and amplification laser arrangements.

5. A laser produced plasma type extreme ultra violet light source apparatus for generating extreme ultra violet light by applying a laser beam to a target, said apparatus comprising:
a chamber in which extreme ultra violet light is generated;
a target supply unit which supplies a liquid or solid metal target to a predetermined position within said chamber;
a laser beam generating unit which synthesizes pulse laser beams having delays different from one another to generate one of a single pulse laser beam and a pulse train laser beam having substantially homogeneous intensity, and applies the laser beam to the target supplied by said target supply unit to generate plasma; and
a collector mirror which collects the extreme ultra violet light radiated from said plasma and outputs the extreme ultra violet light,
wherein said laser beam generating unit includes an oscillation laser device which outputs a pulse laser beam, beam dividing means which divides the pulse laser beam outputted from said oscillation laser device into plural optical paths, and plural amplification devices which respectively amplify the divided pulse laser beams.

6. The extreme ultra violet light source apparatus according to claim 5, wherein said laser beam generating unit further includes beam synthesizing means for synthesizing the pulse laser beams respectively outputted from said plural amplification devices.

7. The extreme ultra violet light source apparatus according to claim 5, wherein the pulse laser beams respectively outputted from said plural amplification devices are synthesized in a plasma generation position.

8. The extreme ultra violet light source apparatus according to claim 5, wherein said laser beam generating unit further includes a beam synthesizer which synthesizes the pulse laser beams respectively outputted from said plural amplification devices.

9. A laser produced plasma type extreme ultra violet light source apparatus for generating extreme ultra violet light by applying a laser beam to a target, said apparatus comprising:
a chamber in which extreme ultra violet light is generated;
a target supply unit which supplies a liquid or solid metal target to a predetermined position within said chamber;
a laser beam generating unit which synthesizes pulse laser beams having delays different from one another to generate one of a single pulse laser beam and a pulse train laser beam having substantially homogeneous intensity, and applies the laser beam to the target supplied by said target supply unit to generate plasma; and
a collector mirror which collects the extreme ultra violet light radiated from said plasma and outputs the extreme ultra violet light,
wherein said laser beam generating unit includes plural oscillation laser devices which respectively output pulse laser beams having delays different from one another, beam synthesizing means for synthesizing the pulse laser beams respectively outputted from said plural oscillation laser devices, and an amplification device including at least one amplifier which amplifies one of a single pulse laser beam and a pulse train laser beam outputted from said beam synthesizing means.

10. The extreme ultra violet light source apparatus according to claim 9, wherein said plural oscillation laser devices respectively output pulse laser beams having delays different from one another and intensity increasing with time, and said at least one amplifier amplifies said one of the single pulse laser beam and the pulse train laser beam outputted from said beam synthesizing means with an amplification factor decreasing with time.

11. A laser produced plasma type extreme ultra violet light source apparatus for generating extreme ultra violet light by applying a laser beam to a target, said apparatus comprising:
- a chamber in which extreme ultra violet light is generated;
- a target supply unit which supplies a liquid or solid metal target to a predetermined position within said chamber;
- a laser beam generating unit which synthesizes pulse laser beams having delays different from one another to generate one of a single pulse laser beam and a pulse train laser beam having substantially homogeneous intensity, and applies the laser beam to the target supplied by said target supply unit to generate plasma; and
- a collector mirror which collects the extreme ultra violet light radiated from said plasma and outputs the extreme ultra violet light, wherein said laser beam generating unit includes an oscillation laser device which outputs a pulse laser beam, beam dividing means for dividing the pulse laser beam outputted from said oscillation laser device into plural optical paths, beam synthesizing means for synthesizing the pulse laser beams having delays different from one another depending on the respective optical paths, and an amplification device including at least one amplifier which amplifies one of a single pulse laser beam and a pulse train laser beam outputted from said beam synthesizing means.

12. The extreme ultra violet light source apparatus according to claim 11, wherein said beam dividing means divides the pulse laser beam outputted from said oscillation laser device into pulse laser beams such that the pulse laser beams have delays different from one another and intensity increasing with time at said beam synthesizing means, and said at least one amplifier amplifies said one of the single pulse laser beam and the pulse train laser beam outputted from said beam synthesizing means with an amplification factor decreasing with time.

* * * * *